US010782603B2

(12) United States Patent
Dai et al.

(10) Patent No.: US 10,782,603 B2
(45) Date of Patent: Sep. 22, 2020

(54) LIGHT WAVELENGTH CONVERSION ELEMENT AND PROJECTION APPARATUS

(71) Applicant: Coretronic Corporation, Hsin-Chu (TW)

(72) Inventors: Jia-Hong Dai, Hsin-Chu (TW); Te-Ying Tsai, Hsin-Chu (TW); Chia-Lun Tsai, Hsin-Chu (TW); Chuan-Hui Liu, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 16/454,074

(22) Filed: Jun. 27, 2019

(65) Prior Publication Data

US 2020/0004122 A1 Jan. 2, 2020

(30) Foreign Application Priority Data

Jul. 2, 2018 (CN) .......................... 2018 1 0705596

(51) Int. Cl.
*G03B 21/20* (2006.01)
*H04N 9/31* (2006.01)
(Continued)

(52) U.S. Cl.
CPC ........... *G03B 21/204* (2013.01); *G03B 21/28* (2013.01); *G03B 33/08* (2013.01); *H01L 33/50* (2013.01); *H04N 9/31* (2013.01)

(58) Field of Classification Search
CPC .... G03B 21/008; G03B 21/28; G03B 21/204; G03B 21/208; G03B 21/2013; G03B 21/2033; G03B 21/2053; G03B 21/2066; G03B 21/2073; H01L 33/50; H01L 33/52; H01L 33/54; H01L 33/56; H01L 33/58;
(Continued)

(56) References Cited

U.S. PATENT DOCUMENTS

2014/0362349 A1 12/2014 Chiu et al.
2016/0252722 A1* 9/2016 Li ............................ F21V 9/32 362/84
2017/0111620 A1* 4/2017 Tian .................... H04N 9/3111

FOREIGN PATENT DOCUMENTS

CN 102073115 5/2011
CN 102900807 1/2013
(Continued)

*Primary Examiner* — Sultan Chowdhury
(74) *Attorney, Agent, or Firm* — JCIPRNET

(57) ABSTRACT

A light wavelength conversion element is configured to receive an excitation beam from a light incident side, comprising a substrate and a light wavelength conversion substance. The substrate has a surface facing the light incident side. The surface has at least one microstructure protruded toward the light incident side. The light wavelength conversion substance is disposed on the surface and covers the at least one microstructure. The light wavelength conversion substance is excited by the excitation beam and emits a conversion beam. The conversion beam forms a light spot on the light wavelength conversion substance. The energy density distribution of the light spot has at least one peak value. A position corresponding to the at least one peak value on the light wavelength conversion substance corresponds to a position of the at least one microstructure. Additionally, a projection apparatus is provided.

18 Claims, 9 Drawing Sheets

IMB 220 250 OA IB' 230 240 RA2 242 244 IB 246 210 LOS S LES C9 M1 C4 110 C3 214 FP C2 CB 212 C5 MS 120 EB C6 RA1 C8 100 130 216 C1 M2 M3 C7

200

(51) Int. Cl.
*G03B 21/28* (2006.01)
*H01L 33/50* (2010.01)
*G03B 33/08* (2006.01)

(58) Field of Classification Search
CPC ... H01L 33/501; H01L 33/502; H01L 33/504; H01L 33/505; H01L 33/508
See application file for complete search history.

(56) References Cited

FOREIGN PATENT DOCUMENTS

| | | |
|---|---|---|
| CN | 106483746 | 3/2017 |
| TW | I579634 | 4/2017 |

* cited by examiner

A
A'
R
LES
LOS
120
S
MS
Ws
Wf
WH
110
E

100
C
RA1
S(110)
130
120
MS
E
A
A'
SP

LIGHT WAVELENGTH CONVERSION ELEMENT AND PROJECTION APPARATUS

CROSS-REFERENCE TO RELATED APPLICATION

This application claims the priority benefit of China application serial no. 201810705596.3, filed on Jul. 2, 2018. The entirety of the above-mentioned patent application is hereby incorporated by reference herein and made a part of this specification.

BACKGROUND OF THE DISCLOSURE

Field of the Disclosure

The disclosure is related to a light wavelength conversion element and a projection apparatus.

Description of Related Art

In the architecture of a projector, basically, yellow light and blue light are outputted by sequentially irradiating the phosphor layer of the phosphor wheel and the light transmitting region (or reflective region) with an excitation beam. When the excitation beam reaches the phosphor glue, the phosphor layer is excited by the excitation beam such that the laser projector emits yellow light. When the excitation beam reaches the light transmitting region (or reflective region), the excitation beam passes through the light transmitting region (or reflected by reflective region) such that the laser projector emits blue light. As the market demand for projector with high brightness is increased, typically the number of excitation light source is increased or excitation light source with high efficiency is used to make the intensity of the excitation beam received by the phosphor layer and the light transmitting region (or reflective region) to increase, such that the brightness of the beam outputted by the laser projector is improved, thereby satisfying the demand for projector with high brightness.

However, the above approach causes the energy density of the excitation beam borne by the phosphor layer to be significantly increased. Since the heat-resistance of the phosphor layer is limited, when the energy density borne by the phosphor layer is too high, its temperature is increased and thus the conversion efficiency of the phosphor layer is attenuated due to the heat. Moreover, the phosphor layer is likely to be burned or cracked, which leads to poor reliability or even malfunction of the projector.

The information disclosed in this BACKGROUND section is only for enhancement of understanding of the BACKGROUND section of the described technology and therefore it may contain information that does not form the prior art that is already known to a person of ordinary skill in the art. Further, the information disclosed in the BACKGROUND section does not mean that one or more problems to be resolved by one or more embodiments of the disclosure was acknowledged by a person of ordinary skill in the art.

SUMMARY OF THE DISCLOSURE

An embodiment of the disclosure provides a light wavelength conversion element, enabling a projection apparatus using the light wavelength conversion element to have good reliability and optical efficiency.

An embodiment of the disclosure provides a projection apparatus having good reliability and optical efficiency.

The objectives and advantages of the disclosure may be further understood in the technical features disclosed in the disclosure.

To achieve one or a part or all the objectives or other objectives, an embodiment of the disclosure provides a light wavelength conversion element having a light incident side. The light wavelength conversion element is configured to receive an excitation beam from the light incident side. The light wavelength conversion element includes a substrate and a light wavelength conversion substance. The substrate has a surface facing the light incident side and is configured to rotate about a center axis. The surface has at least one microstructure protruded toward the light incident side. The light wavelength conversion substance is disposed on the surface and covers the at least one microstructure, and a width of the microstructure along a radial direction of the substrate is smaller than a width of the light wavelength conversion substance along the radial direction. When the excitation beam is transmitted to the light wavelength conversion substance, the light wavelength conversion substance is excited by the excitation beam and emits a conversion beam. The conversion beam forms a light spot on the light wavelength conversion substance. The energy density distribution of the light spot has at least one peak value. A position corresponding to the at least one peak value on the light wavelength conversion substance corresponds to a position of the at least one microstructure.

An embodiment of the disclosure provides a projection apparatus including an illumination system, a light condensing lens, a light valve and a projection lens. The illumination system includes an excitation light source and the light wavelength conversion element. The excitation light source is configured to emit an excitation beam. The illumination system outputs a conversion beam or an excitation beam as an illumination beam. The light condensing lens is disposed on a transmitting path of the excitation beam. The focus of the light condensing lens is deviated from the light wavelength conversion substance on the substrate.

Based on the above, in the light wavelength conversion element and the projection apparatus in the embodiment of the disclosure, through the corresponding relationship between the positions of the peak value of the energy density distribution of the light spot and the microstructure, it is possible to derive the light wavelength conversion element and the projection apparatus with good reliability and optical efficiency.

Other objectives, features and advantages of the present disclosure will be further understood from the further technological features disclosed by the embodiments of the present disclosure wherein there are shown and described preferred embodiments of this disclosure, simply by way of illustration of modes best suited to carry out the disclosure.

DESCRIPTION OF EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
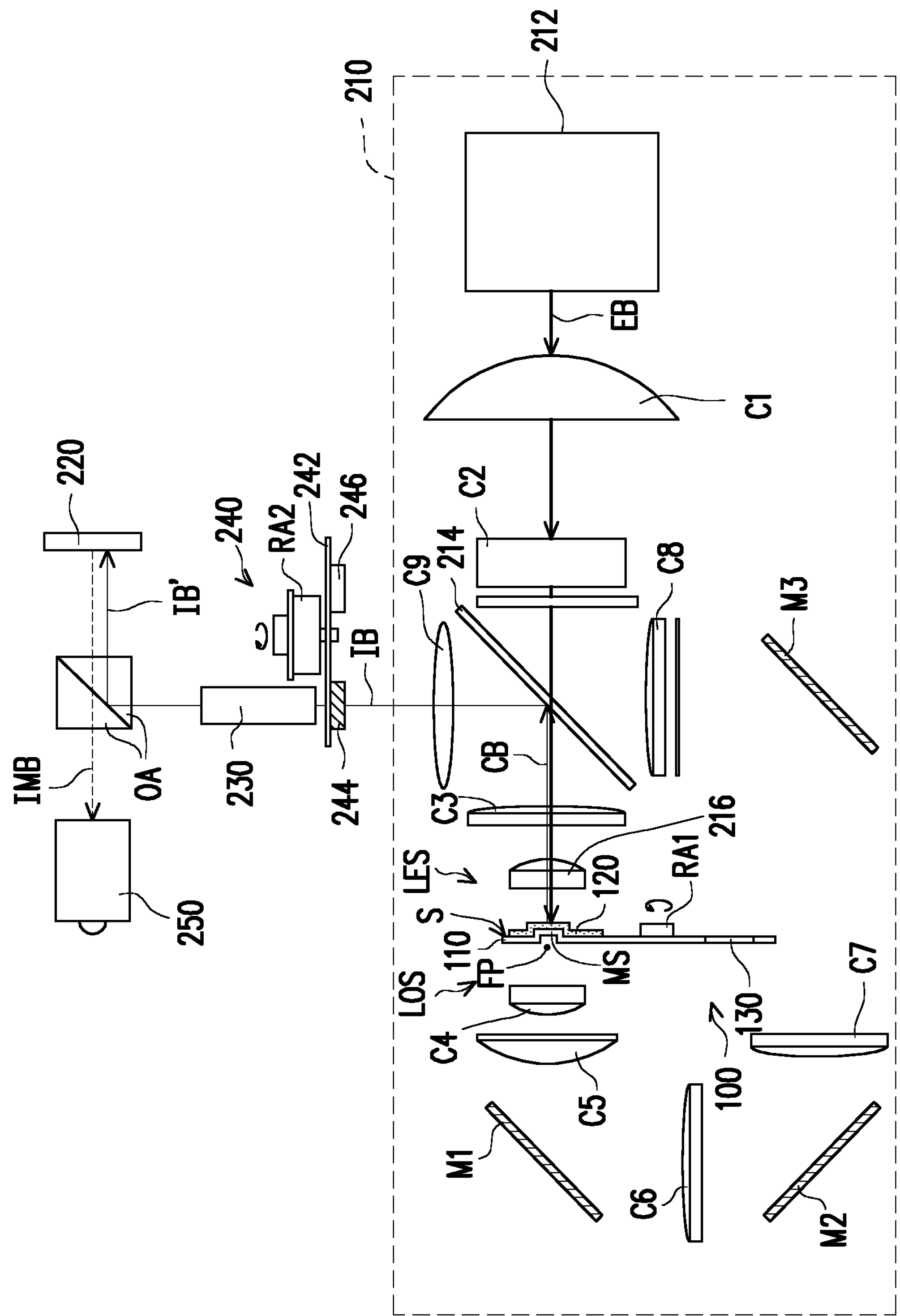
FIG. 1A is a schematic view of a projection apparatus in a first time interval according to an embodiment of the disclosure.
Figure 1B:
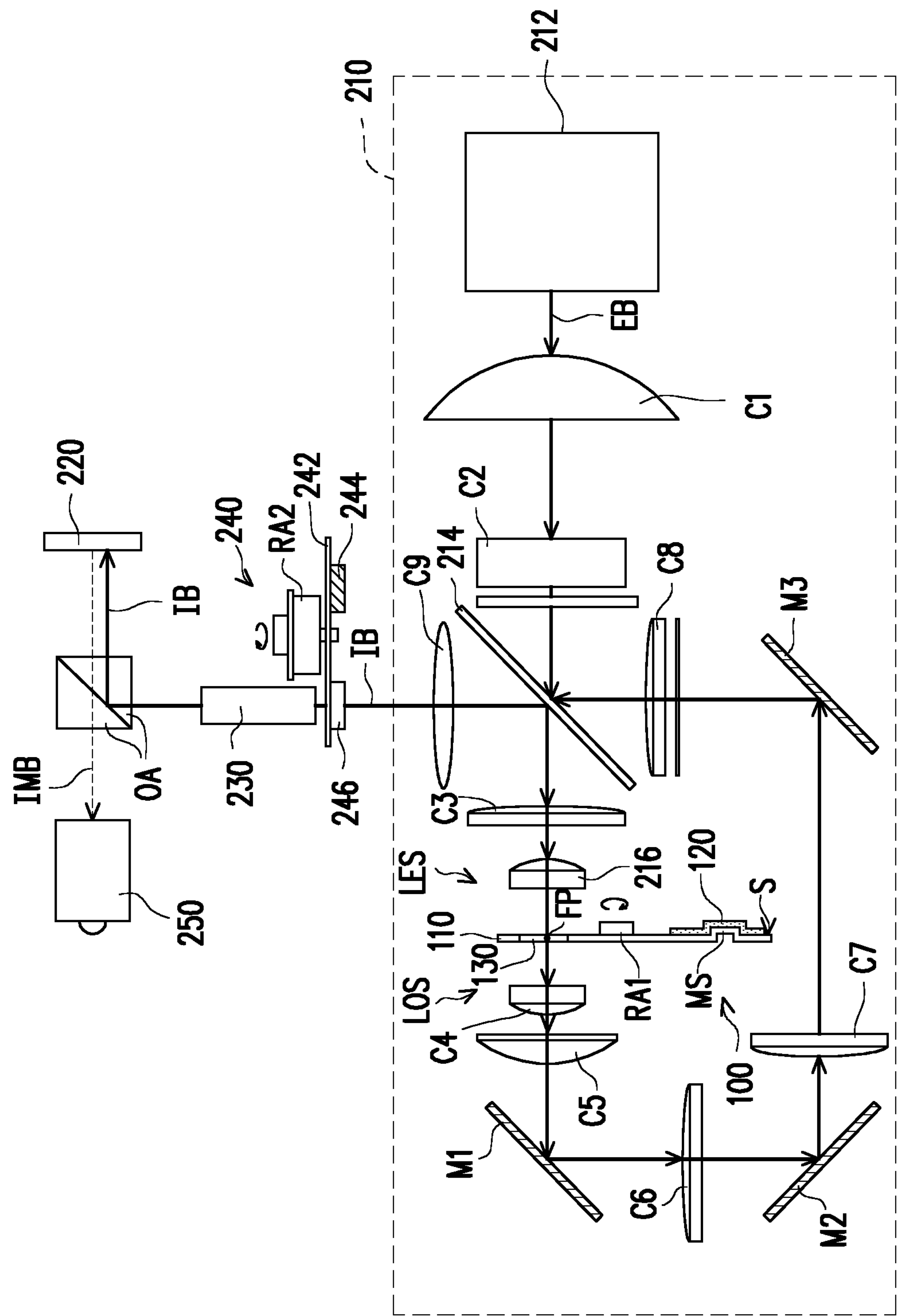
FIG. 1B is a schematic view of a projection apparatus in FIG. 1A in a second time interval.
Figures 1C, 1D:
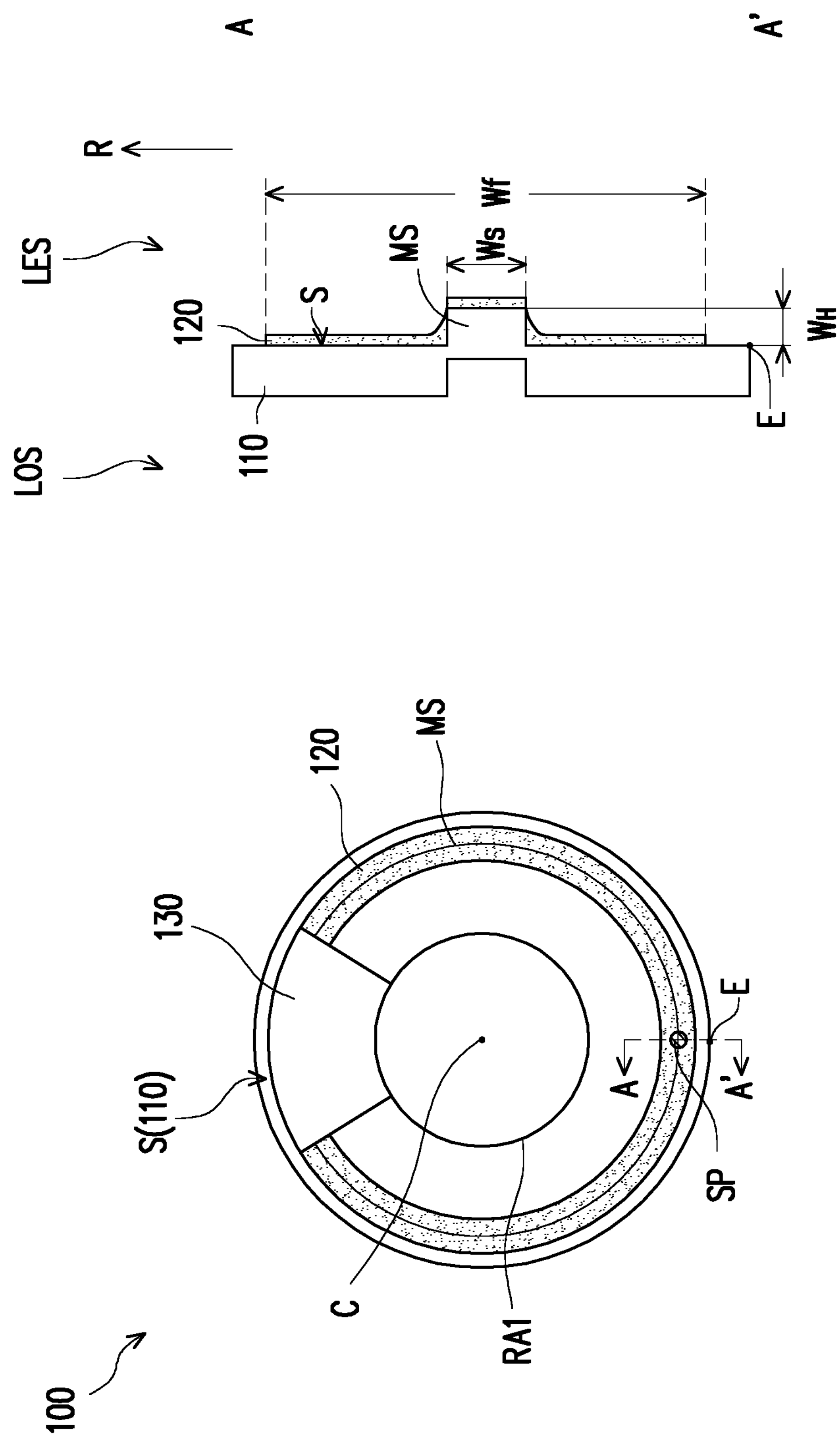
FIG. 1C is a top view of a light wavelength conversion element.
FIG. 1D is a schematic cross-sectional view of FIG. 1C taken along line A-A'.
Figure 1E:
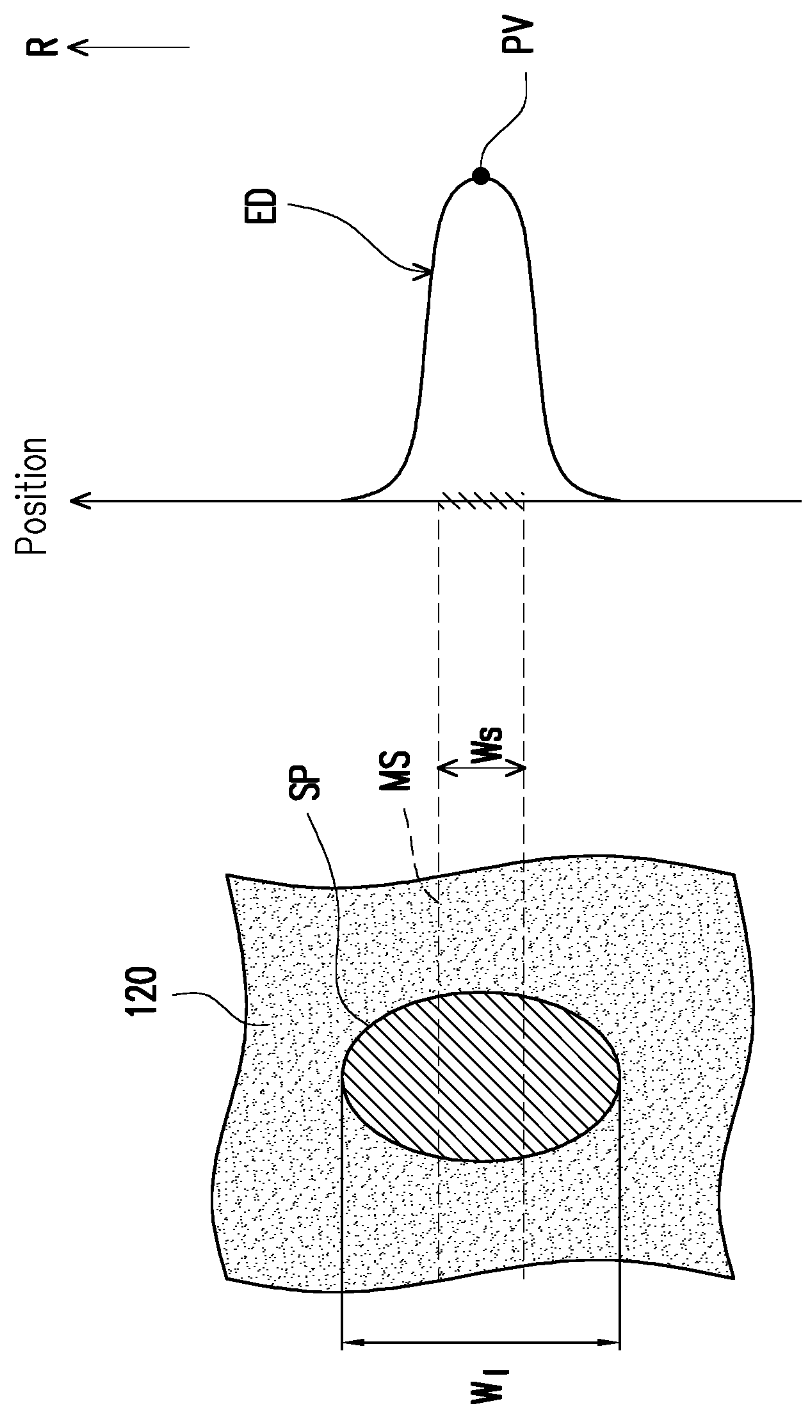
FIG. 1E is an enlarged schematic view of a region in vicinity of light spot in FIG. 1C and a corresponding diagram for relationship between a position of energy density distribution of light spot along a radial direction and a position of a microstructure.

FIG. 1A is a schematic view of a projection apparatus in a first time interval according to an embodiment of the disclosure. FIG. 1B is a schematic view of a projection apparatus in FIG. 1A in a second time interval. FIG. 1C is a top view of a light wavelength conversion element. FIG. 1D is a schematic cross-sectional view of FIG. 1C taken along line A-A'. FIG. 1E is an enlarged schematic view of a region in vicinity of light spot in FIG. 1C and a corresponding diagram for relationship between a position of energy density distribution of light spot along a radial direction and a position of a microstructure.

Referring to FIG. 1A and FIG. 1B, in the embodiment, a projection apparatus 200 includes an illumination system 210, a light valve 220, a light uniformizing element 230, a light filter element 240 and a projection lens 250. The illumination system 210 is configured to output an illumination beam IB to the light valve 220. The illumination system 210 further includes an excitation light source 212, a light splitting element 214, a light wavelength conversion element 100 and a light condensing lens 216. The above elements are described in details below.

In the embodiment of the disclosure, the excitation light source 212 generally refers to a light source that emits a beam having short wavelength. The peak wavelength of the beam having short wavelength, for example, falls within the wavelength range of blue light or the wavelength range of ultraviolet light, wherein the peak wavelength is defined as a wavelength corresponding to the maximum light intensity. The excitation light source 212 may be a laser diode (LD) chip, a light emitting diode (LED) chip or a matrix constituted by one of the above, the disclosure is not limited thereto. The excitation light source 212 is configured to emit an excitation beam EB, and the excitation beam EB is, for example, a blue beam.

In the embodiment of the disclosure, the light splitting element 214 generally refers to an optical element having light splitting function. In the embodiment, the light splitting element is a dichroic mirror (DM) which has wavelength selectivity such as a dichroic element conducting color splitting by utilizing limitations on wavelengths/colors, but not limited thereto. In the embodiment, the light splitting element 214 is designed as a light splitting element capable of reflecting yellow beam and allowing blue beam to pass through.

In the embodiment of the disclosure, the light wavelength conversion element 100 mainly serves as an optical element that converts the short wavelength beam passing through the light wavelength conversion element 100 into a long wavelength beam relative to the short wavelength beam. In the embodiment, the light wavelength conversion element 100 is a phosphor wheel, but not limited thereto. Referring to FIG. 1A and FIG. 1B, in the embodiment, the light wavelength conversion element 100 has a light incident side LES and a light output side LOS opposite to each other. The light wavelength conversion element 100 includes a substrate 110, a light wavelength conversion substance 120, a light transmitting portion 130 and a center axis RA1. The substrate 110 has a surface S facing the light incident side LES. The light wavelength conversion substance 120 is, for example, phosphor powder or other substance having wavelength conversion ability, the disclosure is not limited thereto. The surface S has at least one microstructure MS protruded toward the light incident side LES. In the embodiment, the substrate 110 is, for example, a metal substrate, and the microstructure MS may be formed, for example, through the approach of punching the substrate 110. The microstructure MS, for example, has a cross-sectional surface that is a rectangular structure. Moreover, the cross-sectional surface of the microstructure MS is formed in a Π shape. In FIG. 1C, the number of the at least one microstructure MS is, for example, one, but not limited thereto. The center axis RA1 is disposed in the center of the substrate 110 and extends along a direction perpendicular to the surface S of the substrate 110. The light wavelength conversion substance 120 is disposed on the surface S of the substrate 110 and surrounds the center axis RA1, and the light wavelength conversion substance 120 covers the at least one microstructure MS. The at least one microstructure MS is continuously distributed in the light wavelength conversion substance 120. The light transmitting portion 130 is disposed on the substrate 110, and located adjacent to the light wavelength conversion substance 120. Viewing from another direction, the light transmitting portion 130 and the light wavelength conversion substance 120 form a light-action region having a ring-like shape together. A width $W_s$ of the microstructure MS along a radial direction R of the substrate 110 is smaller than a width $W_f$ of the light wavelength conversion substance 120 along the radial direction R, wherein the radial direction R is defined as a direction (shown in FIG. 1C) connecting any point at an edge E of the substrate 110 to a center point C of the center axis RA1. When the substrate 110 is rotated about the center axis RA1, the light transmitting portion 130 and the light wavelength conversion substance 120 may be driven to rotate by the substrate 110.

In the embodiment of the disclosure, the light condensing lens 216 generally refers to a lens having light condensing function. In the embodiment, the light condensing lens 216 is a convex lens.

In the embodiment of the disclosure, the light valve 220 refers to any one of spatial light modulators such as a digital micro-mirror device (DMD), a liquid-crystal-on-silicon panel (LCOS Panel) or a liquid crystal panel (LCD).

In the embodiment of the disclosure, the light uniformizing element 230 refers to an optical element that uniformizes the beam passing through the light uniformizing element 230. In the embodiment, the light uniformizing element 230 is, for example, an integration rod, a lens array or other optical element having light uniformizing effect, but not limited thereto.

In the embodiment of the disclosure, the light filter element 240 mainly serves as an optical element that filters beams except for the beam having a specific wavelength and allows the beam having the specific wavelength to pass through. In the embodiment, the light filter element 240 is, for example, a filter wheel. The light filter element 240 has a substrate 242, a light filter portion 244, a light transmitting portion 246 and a center axis RA2. The light filter portion 244 and the light transmitting portion 246 form a ring-shaped region together. The light filter portion 244, for example, includes a red light filter and a green light filter. The function of the red light filter is to allow the red light in the beam to pass through but filters all the wavebands in the beam except for the red light. The function of the green light filter is to allow the green light in the beam to pass through but filters all the wavebands except for the green light. The center axis RA2 is disposed in the center of the substrate 242 and extends along a direction perpendicular to a surface of the substrate 242 which the beam is incident on. When the substrate 242 is rotated about the center axis RA2, the light filter portion 244 and the light transmitting portion 246 may be driven to rotate by the substrate 242.

In the embodiment of the disclosure, the projection lens 250 refers to a combination that includes one or more optical lens having refractive power. The optical lens is various combinations consisting of non-plane lens such as bi-concave lens, bi-convex lens, concave-convex lens, convex-concave lens, plano-convex lens and plano-concave lens. The disclosure provides no limitation to the form and type of the projection lens 250.

Additionally, in the embodiment, the interior of the projection apparatus 200 may be selectively provided with one or more reflective mirrors M1-M3 and lenses C1-C9, and the beam transmitting path in the projection apparatus 200 may be adjusted through adjusting the reflective mirrors M1-M3. Moreover, the interior of the projection apparatus 200 may be further selectively provided with an optical prism set OA to adjust the transmitting path of the illumination beam IB output by the illumination system 100.

The configuration relationship between the elements and the optical behavior thereof are described in details below.

Referring to FIG. 1A and FIG. 1B, the light splitting element 214 is disposed on the transmitting path of the excitation beam EB. The light wavelength conversion element 100 is disposed on the transmitting path of the excitation beam EB transmitted from the light splitting element 214. The light wavelength conversion substance 120 (shown in FIG. 1A) and the light transmitting portion 130 (shown in FIG. 1B) of the light wavelength conversion element 100 may be cut into the transmitting path of the excitation beam EB in sequence. The light condensing lens 216 is disposed on the transmitting path of the excitation beam EB. Specifically, the light condensing lens 216 is the last lens before the excitation beam EB is incident onto the light wavelength conversion element 100. The focus FP of the light condensing lens 216 is deviated from the light wavelength conversion substance 120 on the substrate 110. The light filter portion 244 (shown in FIG. 1A) and the light transmitting portion 246 (shown in FIG. 1B) of the light filter element 240 are disposed on the transmitting path of the illumination beam IB. In the embodiment, the projection apparatus 200 controls that the light wavelength conversion element 100 and the light filter element 240 are rotation-synchronized with each other, so that the light transmitting portion 130 of the light wavelength conversion element 100 corresponds to the light transmitting portion 246 of the light filter element 240, and the light wavelength conversion substance 120 of the light wavelength conversion element 100 corresponds to the light filter portion 244 of the light filter element 240. The corresponding relationship mentioned above refers to that the beam is subjected to the light transmitting portion 130 of the light wavelength conversion element 100 passes through the light transmitting portion 246 of the light filter element 240, and the beam that is subjected to the light wavelength conversion substance 120 passes through the light filter portion 244 of the light filter element 240.

Referring to FIG. 1A, first of all, within a first time interval, when the excitation light source 212 emits the excitation beam EB, the excitation beam EB passes through the lens C1, the lens C2, the light splitting element 214 and the lens C3 in sequence, and is condensed by the light condensing lens 216 subsequently to excite the light wavelength conversion substance 120 from the light incident side LES of the light wavelength conversion element 100. The light wavelength conversion substance 120 emits a conversion beam CB after being excited by the excitation beam EB. Referring to FIG. 1C, the conversion beam CB forms a light spot SP on the light wavelength conversion substance 120. Referring to FIG. 1D and FIG. 1E, there is a corresponding relationship between the energy density distribution ED of the light spot SP and the position configuration of the microstructure MS of the substrate 110. Specifically, the energy density distribution ED at least has one peak value PV. In the embodiment, the number of the peak value PV is, for example, one, and the position of the peak value PV is, for example, approximately in the center of the light spot SP. The position of the peak value PV corresponds to the position (as shown in FIG. 1E) of the microstructure MS. In other words, the region with the highest energy density of the light spot SP corresponds to the position of the microstructure MS.

Next, the conversion beam CB is reflected by the substrate 110 or other reflective layer (not shown) and emitted from the light incident side LES, and passes through the light condensing lens 216, the lens C3, the light splitting element 214 and the lens C9 in sequence to be output out of the illumination system 210. The illumination system 210 outputs the conversion beam CB to serve as a part of the illumination beam IB. On this occasion, the light filter portion 244 of the light filter element 240 is cut into the transmitting path of the illumination beam IB through rotation. After being filtered by the red light filter or the green light filter in the light filter portion 244, the illumination beam IB may output red light and green light (i.e., illumination beam IB' after filtering) in sequence within the first time interval, and passes through the light uniformizing element 230 in sequence and guided to the light valve 220 by the optical prism set OA. The light valve 210 converts the filtered illumination beam IB' into an image beam IMB. The image beam IMB passes through the optical prism set OA and projected by the projection lens 250 onto a projection medium (e.g., a projection screen, not shown) to form an image frame.

Referring to FIG. 1B, in a second time interval, when the light transmitting portion 130 of the light wavelength conversion element 100 is cut into the transmitting path of the excitation beam EB, the excitation beam EB from the excitation light source 212 passes through the lens C1, the lens C2, the light splitting element 214 and the lens C3 in sequence, and is subsequently condensed by the light condensing lens 216, and passes through the light transmitting portion 130 from the light incident side LES of the light wavelength conversion element 100 and emitted from the light output side LOS. The excitation beam EB passing through the light transmitting portion 130 passes through the lens C4, the lens C5, the reflective mirror M1, the lens C6, the reflective mirror M2, the lens C7, the reflective mirror M3 and the lens C8 in sequence, and is output out of the illumination system 210 through the light splitting element 214 and the lens C9. The illumination system 210 outputs the excitation beam EB as a part of the illumination beam IB. On this occasion, the light transmitting portion 246 of the light filter element 240 is cut into the transmitting path of the illumination beam IB. The beam behavior of the illumination beam IB after passing through the light transmitting portion 246 is similar to the illumination beam IB' in FIG. 1A after filtering and thus related descriptions are omitted hereinafter.

An embodiment of the projection apparatus 100 is provided below. It should be indicated that the following data does not serve to limit the scope of the disclosure. Persons skilled in the art may make modification to the parameter or setting as appropriate after referring to the disclosure, and such modification still belongs to the scope of the disclosure. Referring to FIG. 1A, FIG. 1B, FIG. 1C, FIG. 1D and Table 1, Table 1 sets the width $W_s$ of the microstructure MS along the radial direction R of the substrate 110 to be 0.8 mm (exemplified as 0.8). The peak value of the energy density distribution of the light spot SP and the optical efficiency of the projection apparatus 100 are simulated under the change of height $W_H$ of different microstructures MS. The configuration of the light wavelength conversion substance 120 is described as above. The light wavelength conversion substance 120 is applied on the microstructure MS, and the width $W_S$ of the microstructure MS along the radial direction R of the substrate 110 is smaller than the width $W_f$ of the light wavelength conversion substance 120 along the radial direction R of the substrate 110. Specifically, the height $W_H$ of the microstructure MS refers to the height of the microstructure MS protruded toward the light incident side LES relative to the surface S of the substrate 110. The related optical data indicating that the width $W_S$ and the height $W_H$ of the microstructure MS are zero represents a comparative example in which the substrate is provided without the microstructure, and the energy density of the corresponding light spot peak value and the optical efficiency are set as 100%, and the energy density of the light spot peak value in other fields and the optical efficiency of the projection apparatus are compared to related optical data in the comparative example. For example, the field showing 97.4 represents that, under the condition that the substrate 110 is provided with the microstructure MS having the width $W_S$ of 0.8 mm and the height $W_H$ of 0.1 mm, the energy density of the peak value of the light spot SP that is simulated is 97.4% of the energy density of the peak value of the light spot in the comparative example in which the substrate is provided without the microstructure, and the rest may be deduced from the above.

TABLE 1

| Width $W_s$ (mm) of microstructure MS | 0 (i.e., in the absence of microstructure) | 0.8 | | | |
|---|---|---|---|---|---|
| Height $W_H$ (mm) of microstructure MS | 0 (i.e., in the absence of microstructure) | 0.1 | 0.15 | 0.2 | 0.3 |
| Energy density (%) of peak value of light spot | 100 | 97.4 | 82.8 | 77.3 | 75.8 |
| Optical efficiency (%) of projection apparatus | 100 | 100 | 99.4 | 97.4 | 90.8 |

In the embodiment, the width $W_S$ of the microstructure MS along the radial direction R is at least 0.3 mm, the height $W_H$ of the protrusion of the microstructure MS relative to the surface S of the substrate 110 is at least 0.1 mm. According to Table 1, when the height $W_H$ falls within the range between 0.15 mm and 0.2 mm, the energy density of the peak value of the light spot SP can be significantly reduced, and the projection apparatus 200 still has good optical efficiency.

In continuation of the above, in the light wavelength conversion element 100 and the projection apparatus 200 in the embodiment, the substrate 110 of the light wavelength conversion element 100 is provided with the protruded microstructure MS, and the light wavelength conversion substance 120 covers the microstructure MS, and the position of the peak value PV of the energy density distribution ED of the light spot SP formed by the conversion beam CB on the light wavelength conversion substance 120 corresponds to the position of the microstructure MS. Meanwhile, the focus FP of the light condensing lens 216 is deviated from the position corresponding to the light wavelength conversion substance 120 covering the microstructure MS on the substrate 110 since the microstructure MS is protruded toward the light incident side LES. In light of the above, the excitation beam EB is entered to the light wavelength conversion substance 120 before being condensed to the focus FP and is excited by the light wavelength conversion substance 120. Since the excitation beam EB is condensed at a low level, the energy density of the excitation beam EB received by the light wavelength conversion substance 120 is relatively low, and is less likely to be burned or cracked as generated in known technology. Accordingly, the light wavelength conversion element 100 and the projection apparatus 200 in the embodiment have good reliability. Moreover, based on the data shown in Table 1, it can be obtained that the light wavelength conversion element 100 and the projection apparatus 200 in the embodiment allow the peak value PV of the energy density distribution ED of the light spot SP to be reduced effectively, and the projection apparatus 200 still has good optical efficiency.

It is to be explained that, the following embodiment has adopted component notations and part of the contents from the previous embodiment, wherein the same notations are used for representing the same or similar components, and descriptions of the same technical contents are omitted. The descriptions regarding the omitted part may be referred to the previous embodiments, and thus are not repeated herein.

Figures 2A, 2B:
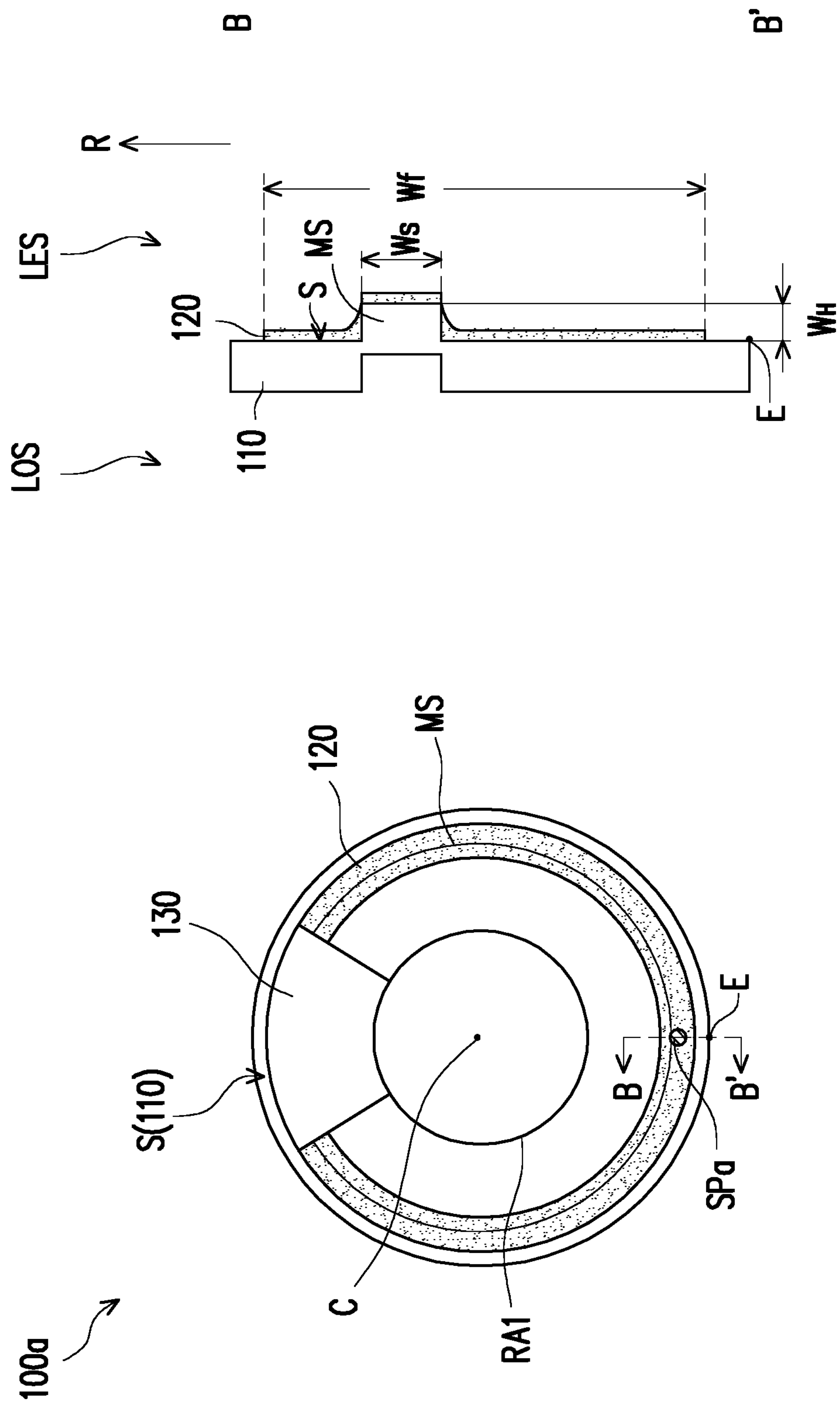
FIG. 2A is a top view of a light wavelength conversion element according to another embodiment of the disclosure.
FIG. 2B is a schematic cross-sectional view of FIG. 2A taken along line B-B'.
Figure 2C:
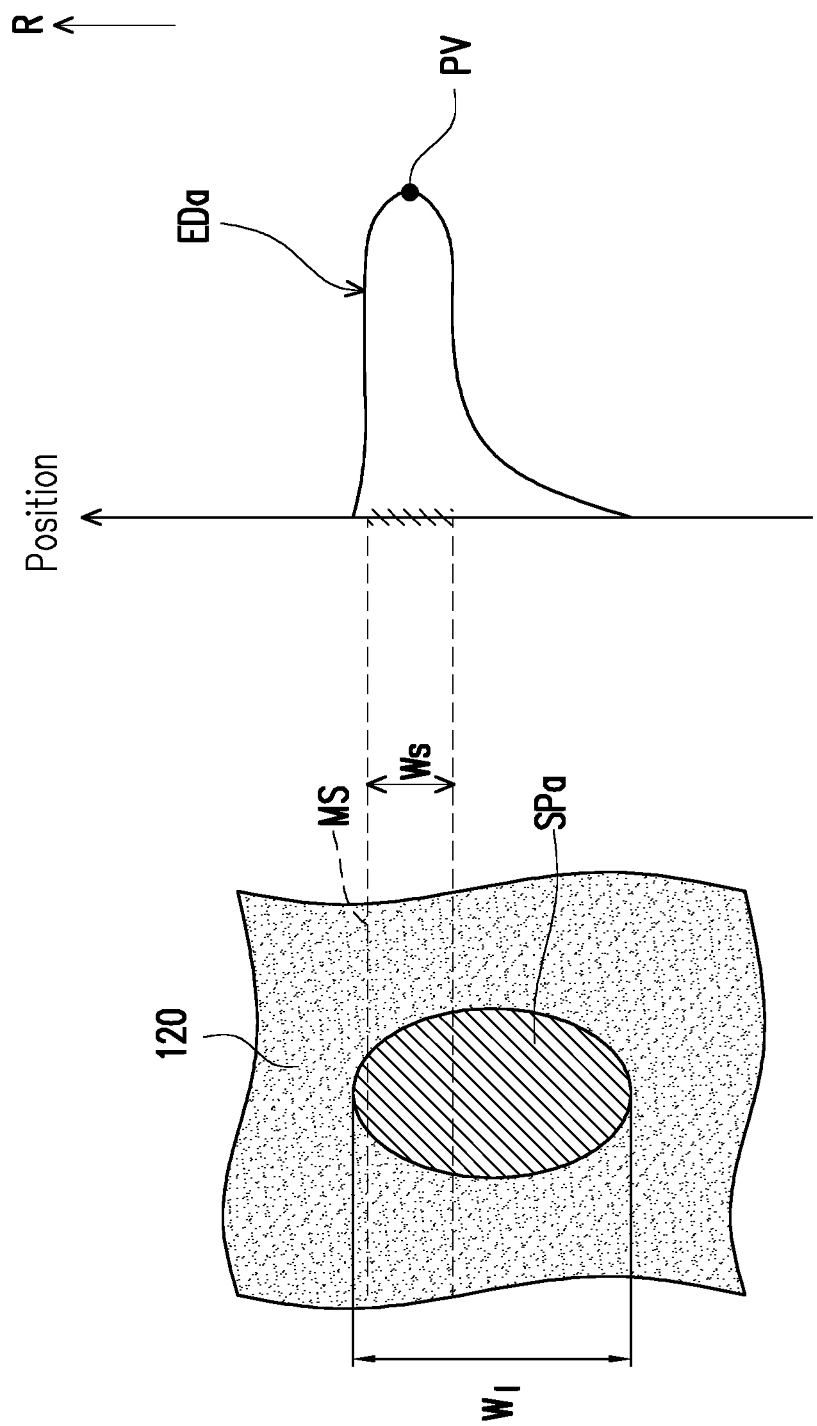
FIG. 2C is an enlarged schematic view of a region in vicinity of light spot in FIG. 2B and a corresponding diagram for relationship between a position of energy density distribution of light spot along a radial direction and a position of a microstructure.

FIG. 2A is a top view of a light wavelength conversion element according to another embodiment of the disclosure. FIG. 2B is a schematic cross-sectional view of FIG. 2A taken along line B-B'. FIG. 2C is an enlarged schematic view of a region in vicinity of light spot in FIG. 2B and a corresponding diagram for relationship between a position of energy density distribution of light spot along a radial direction and a position of a microstructure.

Referring to FIG. 2A, FIG. 2B and FIG. 2C, a light wavelength conversion element 100*a* is substantially similar to the light wavelength conversion element 100 in FIG. 1A to FIG. 1E, and the main difference between the two is that, the position of the peak value PV of an energy density distribution EDa of a light spot SPa is not in the center of the light spot SPa, the position of the peak value PV of the energy density distribution EDa is at the edge of the light spot SPa; therefore, the position of the microstructure MS is disposed corresponding to the edge of the light spot SPa.

Figures 3A, 3B:
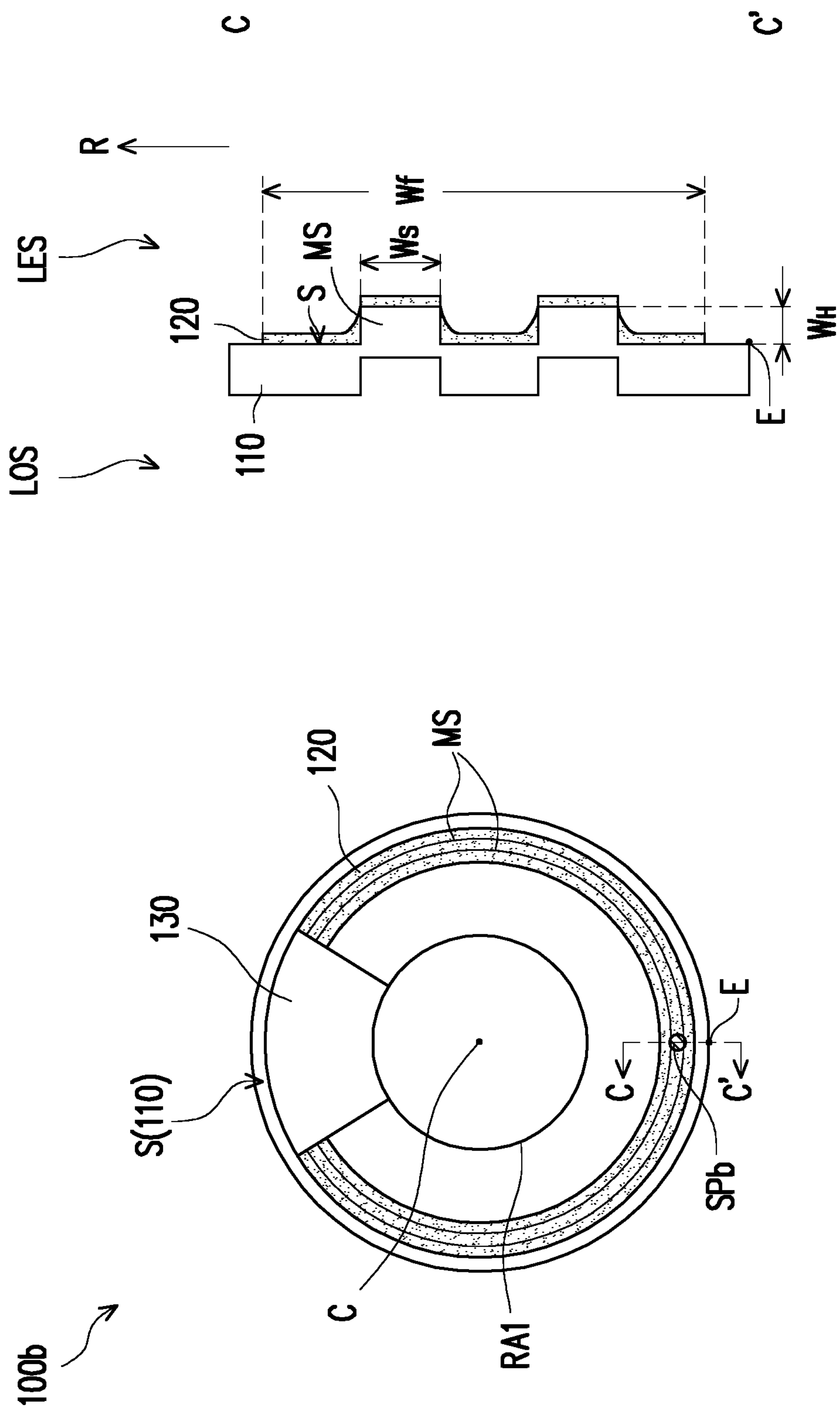
FIG. 3A is a top view of a light wavelength conversion element according to still another embodiment of the disclosure.
FIG. 3B is a schematic cross-sectional view of FIG. 3A taken along line C-C'.
Figure 3C:
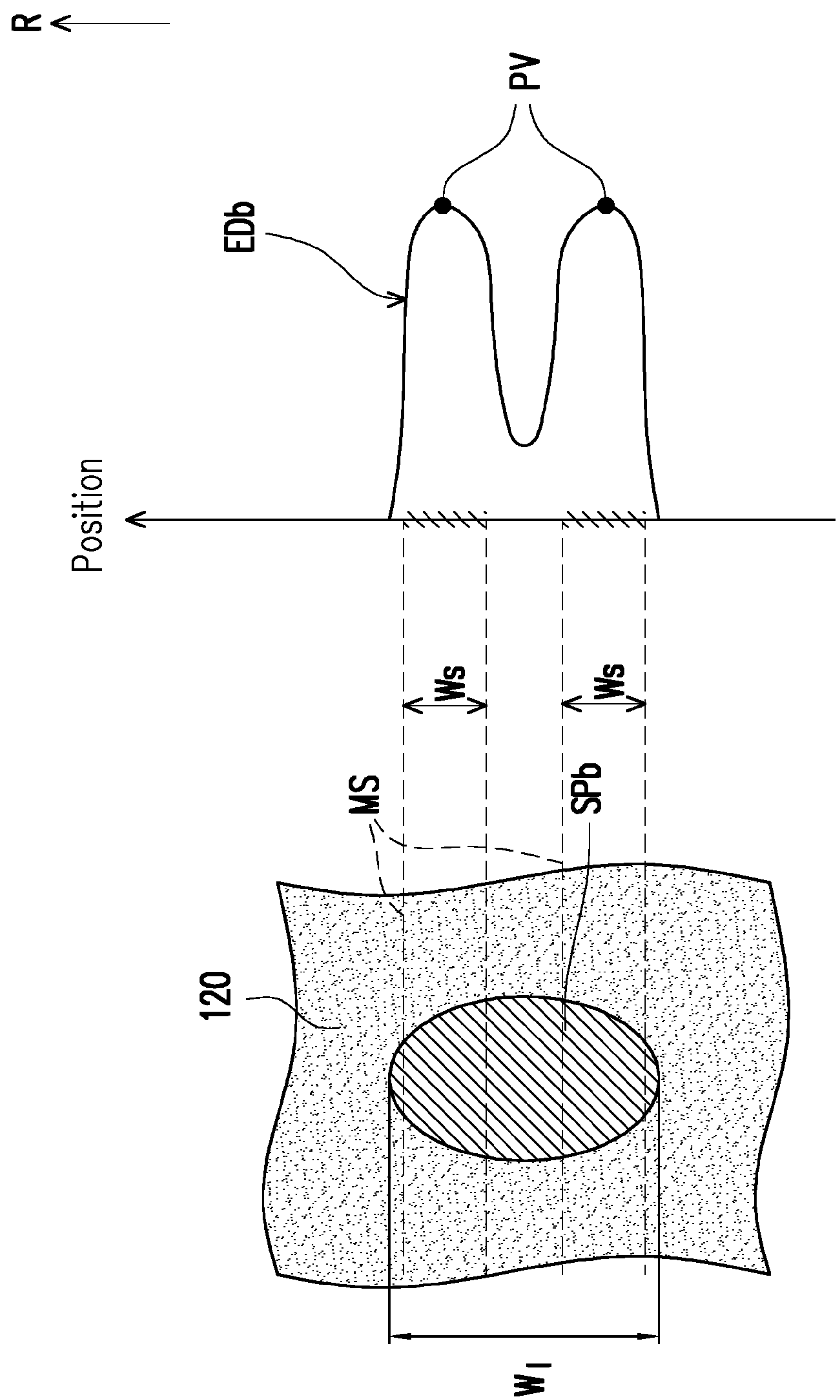
FIG. 3C is an enlarged schematic view of a region in vicinity of light spot in FIG. 3B and a corresponding diagram for relationship between a position of energy density distribution of light spot along a radial direction and a position of a microstructure.

FIG. 3A is a top view of a light wavelength conversion element according to still another embodiment of the disclosure. FIG. 3B is a schematic cross-sectional view of FIG. 3A taken along line C-C'. FIG. 3C is an enlarged schematic view of a region in vicinity of light spot in FIG. 3B and a corresponding diagram for relationship between a position of energy density distribution of light spot along a radial direction and a position of a microstructure.

Referring to FIG. 3A, FIG. 3B and FIG. 3C, a light wavelength conversion element 100*b* is substantially similar to the light wavelength conversion element 100 in FIG. 1A to FIG. 1E, and the main difference between the two is that the energy density distribution EDb of a light spot SPb has a plurality of peak values PV, and two peak values PV are shown as an example, the disclosure is not limited thereto. At least one microstructure MS is a plurality of microstructure MS, and for example, exemplified as two microstructures MS, and the two microstructures MS are spaced apart from each other. A position corresponding to one peak value PV of the light spot SPb on the light wavelength conversion substance 120 corresponds to the position of one microstructure MS. The positions of the two microstructures MS respectively correspond to two peak values PV of the light spot SPb.

Figures 4A, 4B, 4C, 4D:
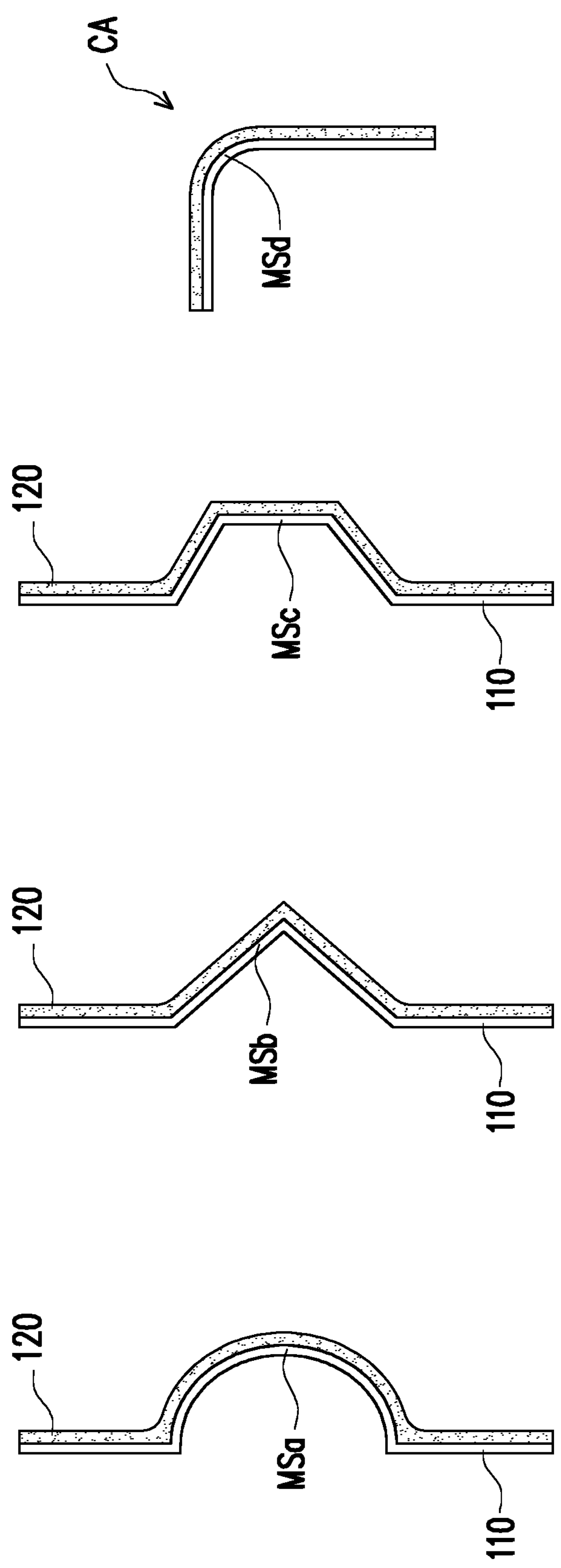
FIG. 4A to FIG. 4C are schematic cross-sectional views respectively illustrating different microstructures.
FIG. 4D is a schematic cross-sectional view of a microstructure having a chamfer angle.

FIG. 4A to FIG. 4C are schematic cross-sectional views respectively illustrating different microstructures. FIG. 4D is a schematic cross-sectional view of a microstructure having a chamfer angle.

The microstructure MS shown in FIG. 1A to FIG. 3C is, for example, a rectangular structure, and may be, for example, formed by punching the substrate 110. Referring to FIG. 4A to FIG. 4C, in FIG. 4A, a microstructure MSa is a semi-circle structure. In FIG. 4B, the microstructure MSb is a V-shaped structure. In FIG. 4C, the microstructure MSc is a trapezoid structure. FIG. 4D shows a microstructure MSd having a chamfer angle CA, and the chamfer angle CA is disposed at an edge of the microstructure MSd. The microstructures that are shown in FIG. 1A to FIG. 1E and FIG. 4A to FIG. 4C may be selectively changed into a chamfer angle CA at the corresponding sharp edge, the disclosure is not limited thereto.

It should be indicated that the light wavelength conversion elements 100*a* and 100*b* in FIG. 2A to FIG. 2C and FIG. 3A to FIG. 3C may be selectively applied to the projection apparatus 200 in FIG. 1A and FIG. 1B. Additionally, the microstructure MS having a rectangular structure in FIG. 1A may be changed into the microstructure having different aspects as shown in FIG. 4A to FIG. 4C, the disclosure is not limited thereto.

The light wavelength conversion elements 100, 100*a* and 100*b* as well as the projection apparatus 200 in the embodiments of the disclosure may further satisfy the following conditions: $W_I/W_S$ fall within the range between 1.75 and 17.5, wherein $W_I$ is a width of light spots SP, SPa and SPb along the radial direction R, $W_S$ is the width of the microstructure MS along the radial direction R. By satisfying the above conditions, the light wavelength conversion element and the projection apparatus may have better optical efficiency and reliability.

The light wavelength conversion elements 100, 100*a* and 100*b* as well as the projection apparatus 200 in the embodiments of the disclosure may further satisfy the following conditions: $W_I/W_H$ fall within the range between 11 and 35, wherein $W_I$ is the width of light spots SP, SPa and SPb along the radial direction R, $W_H$ is the height of the protrusion of the microstructure MS relative to the surface S of the substrate 110. By satisfying the above conditions, the light wavelength conversion element and the projection apparatus may have better optical efficiency and reliability.

To sum up, in the light wavelength conversion element and projection apparatus in the embodiments of the disclosure, the surface of the substrate of the light wavelength conversion element facing the light incident side is provided with a protruded microstructure, and the position of the peak value of the energy density distribution of the light spot corresponds to the position of the microstructure. Meanwhile, the focus of the light condensing lens is deviated from the position of the light wavelength conversion substance on the substrate due to the protruded microstructure. In light of the foregoing, the energy density of the excitation beam received by the light wavelength conversion substance is relatively low and thus is less likely to be burned or cracked as generated in known technology. Furthermore, in the operation process of the projection apparatus, the operation temperature of the light wavelength conversion substance is reduced correspondingly, thus avoiding the problem that the conversion efficiency is attenuated due to the heat. Accordingly, the light wavelength conversion element and the projection apparatus may have good reliability and optical efficiency.

The foregoing description of the preferred embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the disclosure and its best mode practical application, thereby to enable persons skilled in the art to understand the disclosure for various embodiments and with various modifications as are suited to the particular use or implementation contemplated. It is intended that the scope of the disclosure be defined by the claims appended hereto and their equivalents in which all terms are meant in their broadest reasonable sense unless otherwise indicated. Therefore, the term "the disclosure", "the present disclosure" or the like does not necessarily limit the claim scope to a specific embodiment, and the reference to particularly preferred exemplary embodiments of the disclosure does not imply a limitation on the disclosure, and no such limitation is to be inferred. The disclosure is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the disclosure. It should be appreciated that variations may be made in the embodiments described by persons skilled in the art without departing from the scope of the present disclosure as defined by the following claims. Moreover, no element and component in the present disclosure is intended to be dedicated to the public regardless of whether the element or component is explicitly recited in the following claims.

What is claimed is:

1. A light wavelength conversion element, having a light incident side, the light wavelength conversion element configured to receive an excitation beam from the light incident side, the light wavelength conversion element comprising: a substrate and a light wavelength conversion substance; wherein, the substrate having a surface facing the light incident side and configured to rotate about a center axis, the surface having at least one microstructure protruded toward the light incident side; and the light wavelength conversion substance disposed on the surface and covering the at least one microstructure, and a width of the microstructure along a radial direction of the substrate is smaller than a width of the light wavelength conversion substance along the radial direction, wherein when the excitation beam is transmitted to the light wavelength conversion substance, the light wavelength conversion substance is excited by the excitation beam and emits a conversion beam, the conversion beam forms a light spot on the light wavelength conversion substance, an energy density distribution of the light spot has at least one peak value, a position corresponding to the at least one peak value on the light wavelength conversion substance corresponds to a position of the at least one microstructure.

2. The light wavelength conversion element according to claim 1, wherein a width of the light spot along the radial direction is $W_I$, a width of the microstructure along the radial direction is $W_S$, and a ratio $W_I/W_S$ of the width of the light spot to the width of the microstructure is in a range between 1.75 and 17.5.

3. The light wavelength conversion element according to claim 1, wherein a width of the light spot along the radial direction is $W_I$, a height of the microstructure protruded relative to the surface is $W_H$, and a ratio $W_I/W_H$ of the width of the light spot to the height of the microstructure is in a range between 11 and 35.

4. The light wavelength conversion element according to claim 1, wherein the at least one peak value of the energy density distribution of the light spot is a plurality of peak values, the at least one microstructure is a plurality of microstructures.

5. The light wavelength conversion element according to claim 1, wherein the at least one microstructure is a rectangular structure, a semi-circle structure, a V-shaped structure or a trapezoid structure.

6. The light wavelength conversion element according to claim 1, wherein the at least one microstructure has a chamfer angle.

7. The light wavelength conversion element according to claim 1, wherein the at least one microstructure is continuously distributed in the light wavelength conversion substance.

8. The light wavelength conversion element according to claim 1, further comprising a light transmitting portion disposed on the substrate, wherein the light transmitting portion and the light wavelength conversion substance are disposed on the substrate adjacent to each other, when the substrate is rotated about the center axis, the light transmitting portion and the light wavelength conversion substance cut into a transmitting path of the excitation beam alternately.

9. The light wavelength conversion element according to claim 8, wherein when the light transmitting portion cuts into the transmitting path of the excitation beam, the excitation beam passes through the light transmitting portion.

10. A projection apparatus, comprising an illumination system, a light valve and a projection lens, wherein the illumination system comprises an excitation light source, a light wavelength conversion element and a light condensing lens, wherein the excitation light source is configured to emit an excitation beam;

the light wavelength conversion element has a light incident side, the light wavelength conversion element is configured to receive the excitation beam from the light incident side, the light wavelength conversion element comprises a substrate and a light wavelength conversion substance; wherein the substrate has a surface facing the light incident side and is configured to rotate about a center axis, the surface has at least one microstructure protruded toward the light incident side;

the light wavelength conversion substance is disposed on the surface and covers the at least one microstructure, and a width of the microstructure along a radial direction of the substrate is smaller than a width of the light wavelength conversion substance along the radial direction, wherein when the excitation beam is transmitted to the light wavelength conversion substance, the light wavelength conversion substance is excited by the excitation beam and emits a conversion beam, the conversion beam forms a light spot on the light wavelength conversion substance, wherein an energy density distribution of the light spot has at least one peak value, a position corresponding to the at least one peak value on the light wavelength conversion substance corresponds to a position of the at least one microstructure, and the illumination system outputs the conversion beam or the excitation beam as an illumination beam;

the light condensing lens is disposed on a transmitting path of the excitation beam, wherein a focus of the light condensing lens is deviated from the light wavelength conversion substance on the substrate;

the light valve is disposed on a transmitting path of the illumination beam to convert the illumination beam into an image beam;

the projection lens is disposed on a transmitting path of the image beam.

11. The projection apparatus according to claim 10, wherein a width of the light spot along the radial direction is $W_I$, a width of the microstructure along the radial direction is $W_S$, and a ratio $W_I/W_S$ of the width of the light spot to the width of the microstructure is in a range between 1.75 and 17.5.

12. The projection apparatus according to claim 10, wherein a width of the light spot along the radial direction is $W_I$, a height of the microstructure protruded relative to the surface is $W_H$, and a ratio $W_I/W_H$ of the width of the light spot to the height of the microstructure is in a range between 11 and 35.

13. The projection apparatus according to claim 10, wherein the at least one peak value of the energy density distribution of the light spot is a plurality of peak values, the at least one microstructure is a plurality of microstructures.

14. The projection apparatus according to claim 10, wherein the at least one microstructure is a rectangular structure, a semi-circle structure, a V-shaped structure or a trapezoid structure.

15. The projection apparatus according to claim 10, wherein the at least one microstructure has a chamfer angle.

16. The projection apparatus according to claim 10, wherein the at least one microstructure is continuously distributed in the light wavelength conversion substance.

17. The projection apparatus according to claim 10, wherein the light wavelength conversion element further comprises a light transmitting portion disposed on the substrate, the light transmitting portion and the light wavelength conversion substance are disposed on the substrate adjacent to each other, and when the substrate is rotated about the center axis, the light transmitting portion and the light wavelength conversion substance cut into a transmitting path of the excitation beam alternately.

18. The projection apparatus according to claim 17, wherein when the light transmitting portion cuts into the transmitting path of the excitation beam, the excitation beam passes through the light transmitting portion to be output out of the illumination system.

* * * * *